(12) United States Patent
Hao et al.

(10) Patent No.: US 7,332,750 B1
(45) Date of Patent: Feb. 19, 2008

(54) POWER SEMICONDUCTOR DEVICE WITH IMPROVED UNCLAMPED INDUCTIVE SWITCHING CAPABILITY AND PROCESS FOR FORMING SAME

(75) Inventors: Jifa Hao, White Haven, PA (US); John L. Benjamin, Mountaintop, PA (US); Randall L. Case, Mountaintop, PA (US); Jae J. Yun, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/654,845

(22) Filed: Sep. 1, 2000

(51) Int. Cl.
*H01L 29/74* (2006.01)
*H01L 29/30* (2006.01)

(52) U.S. Cl. .................. 257/131; 257/130; 257/327; 257/335; 257/617

(58) Field of Classification Search ........... 257/119, 257/126, 130–131, 155–156, 327–329, 335–343, 257/609–612, 617, 655–657
See application file for complete search history.

(56) References Cited

U.S. PATENT DOCUMENTS

| | | | |
|---|---|---|---|
| 3,662,233 A | 5/1972 | Clerc et al. | |
| 3,961,989 A | 6/1976 | Heslop | |
| 4,064,620 A | 12/1977 | Lee et al. | |
| 4,354,140 A | 10/1982 | Nishizawa | |
| 4,369,072 A | 1/1983 | Bakeman et al. | |
| 4,492,810 A | 1/1985 | Ovshinsky et al. | |
| 4,809,047 A * | 2/1989 | Temple | 257/145 |
| 4,818,357 A | 4/1989 | Case et al. | |
| 4,897,757 A | 1/1990 | Tailliet et al. | |
| 5,063,428 A * | 11/1991 | Schlangenotto et al. | 257/656 |
| 5,119,148 A | 6/1992 | Anderson et al. | |
| 5,171,705 A * | 12/1992 | Choy | 438/273 |
| 5,514,620 A | 5/1996 | Aoki et al. | |
| 5,545,908 A * | 8/1996 | Tokura et al. | 257/341 |
| 5,747,872 A | 5/1998 | Lutz et al. | |
| 5,773,858 A | 6/1998 | Schlangenotto et al. | |
| 5,774,348 A | 6/1998 | Druce et al. | |
| 6,358,825 B1 * | 3/2002 | Hao et al. | 438/543 |

FOREIGN PATENT DOCUMENTS

| | | | |
|---|---|---|---|
| JP | 55-61064 | * | 5/1980 |
| JP | 1-238025 | * | 9/1989 |

* cited by examiner

*Primary Examiner*—Ori Nadav
(74) *Attorney, Agent, or Firm*—Hiscock & Barclay, LLP; Thomas R. Fitzgerald, Esq

(57) ABSTRACT

A power semiconductor device having high avalanche capability comprises an $N^+$ doped substrate and, in sequence, $N^-$ doped, $P^-$ doped, and $P^+$ doped semiconductor layers, the $P^-$ and $P^+$ doped layers having a combined thickness of about 5 μm to about 12 μm. Recombination centers comprising noble metal impurities are disposed substantially in the $N^-$ and $P^-$ doped layers. A process for forming a power semiconductor device with high avalanche capability comprises: forming an $N^-$ doped epitaxial layer on an $N^+$ doped substrate, forming a $P^-$ doped layer in the $N^-$ doped epitaxial layer, forming a $P^+$ doped layer in the $P^-$ doped layer, and forming in the $P^-$ and $N^-$ doped layers recombination centers comprising noble metal impurities. The $P^+$ and $P^-$ doped layers have a combined thickness of about 5 μm to about 12 μm.

17 Claims, 1 Drawing Sheet

POWER SEMICONDUCTOR DEVICE WITH IMPROVED UNCLAMPED INDUCTIVE SWITCHING CAPABILITY AND PROCESS FOR FORMING SAME

FIELD OF THE INVENTION

The present invention relates to semiconductor devices and, more particularly, to power devices having high avalanche capability and a process for making them.

BACKGROUND OF THE INVENTION

Many applications for power semiconductors require fast switching devices having low power dissipation. Anderson et al., U.S. Pat. No. 5,119,148, the disclosure of which is incorporated herein by reference, describes a high voltage (600-1000 volts or higher), fast damper diode comprising $P^+$, $P^-$, $N^-$, $N^+$ layer wherein the $P^-$ and $N^-$ layers are of substantially equal thickness, each greater than about 50 μm, and have substantially equal doping density of less than about $10^{15}$ atoms/cm$^3$. Lutz et al., U.S. Pat. No. 5,747,872, the disclosure of which is incorporated herein by reference, describes a fast power diode comprising $P^+$, $N^-$, and $N^+$ doping zones, and recombination centers formed by electron irradiation and platinum diffusion in the $N^-$ and $N^+$ zones.

Among the measures of diode performance are the following: rated forward current (IF), forward voltage drop (VF), transient forward recovery time (TFR), transient turn-on peak overshoot voltage (TOPO), diode reverse blocking voltage (BVR), transient reverse recovery time (TRR), and unclamped inductive switching (UIS), which is a measure of the amount of avalanche energy that can be dissipated in the device without destructive failure. BVR and UIS can be increased by increasing the resistivity and/or the thickness of the diode depletion region, but this typically results in also increasing TFR and TOPO. TRR can be lowered by the introduction of recombination centers, but this also generally leads to an increase in VF. TOPO and VF may be reduced and IF increased by increasing the diode area, i.e., die size, but this is undesirable both from the view point of cost and the trend toward reducing device size.

Because the rapid switching of high currents can result in the generation by parasitic inductance of voltage spikes that reach the breakdown voltage of a device, there is an ongoing need for power semiconductor devices in switching applications, for example, where the dissipation of large amounts of avalanche energy without damage is required. The present invention meets this need.

SUMMARY OF THE INVENTION

The present invention is directed to a power semiconductor device having high avalanche capability and comprising an $N^+$ doped substrate and, in sequence, $N^-$ doped, $P^-$ doped, and $P^+$ doped semiconductor layers, the $P^-$ and $P^+$ doped layers having a combined thickness of about 5 μm to about 12 μm. Recombination centers comprising noble metal impurities are disposed substantially in the $N^-$ and $P^-$ doped layers.

The present invention is further directed to a process for forming a power semiconductor device with high avalanche capability that comprises: forming an $N^-$ doped epitaxial layer on an $N^+$ doped substrate, forming a $P^-$ doped layer in the $N^-$ doped epitaxial layer, forming a $P^+$ doped layer in the $P^-$ doped layer, and forming in the $P^-$ and $N^-$ doped layers recombination centers comprising noble metal impurities. The $P^+$ and $P^-$ doped layers have a combined thickness of about 5 μm to about 12 μm.

The present invention beneficially provides devices of small die size whose UIS performance is comparable to that of conventional devices of much larger die size.

DETAILED DESCRIPTION OF THE INVENTION

Figure 1:
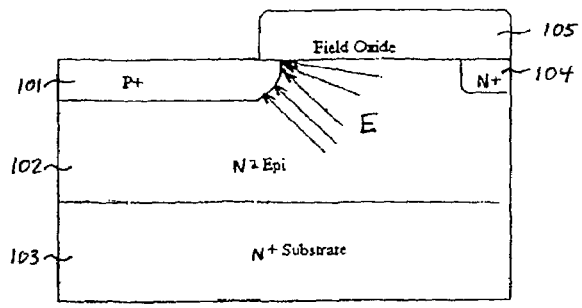
FIG. 1 is a schematic representation of a prior art diode comprising a $P^+$ doped layer formed in an $N^-$ epitaxial layer that is disposed on an $N^+$ semiconductor substrate.

In FIG. 1 is schematically depicted a prior art power diode 100 that includes $P^+$ doped, $N^-$ doped, and $N^+$ doped semiconductor layers 101, 102, and 103, respectively. Also included in diode 100 is a heavily $N^+$ doped source region 104 and a field oxide layer 105. The arrows E indicate the electrical field at the corner of the pn junction of diode 100 in the reverse biased condition.

Figure 2:
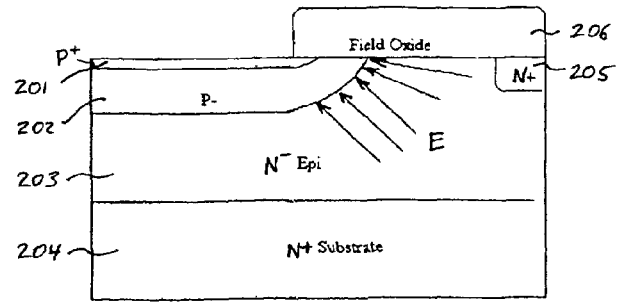
FIG. 2 is a schematic representation of a semiconductor device of the present invention that includes an $N^+$ doped substrate bearing $N^-$ doped, $P^-$ doped, and $P^+$ doped semiconductor layers, with platinum atom combination centers in the $N^-$ and $P^-$ doped layers.

FIG. 2 schematically illustrates a power diode 200 in accordance with the present invention that includes $P^+$ doped, $P^-$ doped, and $N^-$ doped layers 201, 202, and 203, respectively, on an $N^+$ doped semiconductor substrate 204. Layer 203 preferably is epitaxially formed on substrate 204, which can be doped with antimony, phosphorus, or, preferably, arsenic. $N^-$ doped epitaxial layer 203 can be grown with a dopant level of about $10^{14}$ atoms/cm$^3$ to about $10^{15}$ atoms/cm$^3$ of arsenic or, preferably, phosphorus.

Layers 201 and 202 are formed by dopant implantation and/or diffusion into epitaxial layer 203. Shallow $P^+$ doped layer 201 has a thickness preferably of about 0.1 μm to about 2 μm, and $P^-$ doped layer 202 has a thickness preferably of about 4 μm to about 10 μm. $P^+$ doped layer 201 and $P^-$ doped layer 202 together have a combined thickness of about 5 μm to about 12 μm. Shallow $P^+$ doped layer 201 has a dopant level preferably of at least $10^{18}$ atoms/cm$^3$, more preferably, about $6\times10^{19}$ atoms/cm$^3$. $P^-$ doped layer 202 has a dopant level preferably of at least $10^{16}$ atoms/cm$^3$, more preferably, about $2.5\times10^{17}$ atoms/cm$^3$. A preferred dopant for layers 201 and 202 is boron.

Recombination centers comprising noble metal impurities are introduced into $N^-$ doped layer 203 and $P^-$ doped layer 202, preferably by diffusion through $N^+$ doped substrate 204. Noble metal impurities are selected from the group consisting of gold, platinum, and palladium, platinum being preferred. Diffusion of platinum is carried out at a temperature of, preferably, about 940° C., resulting in a concentration of platinum in diode 200 of about $1\times10^{15}$ to about $1\times10^{16}$ atoms/cm$^3$, preferably about $2\times10^{15}$ atoms/cm$^3$. Lowering the platinum diffusion temperature from 950° C. to 940° C. reduces the concentration of platinum impurities and improves the avalanche capability of diode 200.

Also included in diode 200 is a heavily N+ doped source region 205, which provides a channel stop for improved reliability, and a field oxide layer 206. As shown in FIG. 2, the N+ doped source region 205 is disposed in the N− doped epitaxial layer 203, thereby laterally spacing the N+ doped source region 205 from the P+ doped region 201 and P− doped well 202. As shown by comparison of FIGS. 1 and 2, the electrical field, represented by the arrows E, is substantially more dispersed at the corner of the pn junction of diode 200 of the present invention compared with prior art diode 100.

A heavily arsenic doped $N^+$ substrate on which is formed a phosphorus doped $N^-$ epitaxial layer with a thickness of about 21 μm to about 27 μm, preferably about 25 μm, is used to form a series of control devices and devices of the present invention. For the control device series, whose general structure is represented by FIG. 1, a heavily $P^+$ doped layer is formed by boron implantation and diffusion to a depth of about 8-10 μm. Prior to metallization, platinum is deposited on the bottom of the substrate and diffused at a temperature of about 950° C., resulting in a platinum concentration in the $N^-$ layer of about $5.8 \times 10^{15}$ atoms/cm$^3$. The control series includes devices with die sizes of 160×160 mil$^2$ (ca. 4×4 mm$^2$), 80×80 mil$^2$ (ca. 2×2 mm$^2$), and 60×60 mil$^2$ (ca. 1.5×1.5 mm$^2$).

The epitaxial wafer used to form the series of control devices is also employed to form a series of devices in accordance with the present invention, whose general structure is represented by FIG. 2. A $P^-$ doped layer having an average concentration of about $2.5 \times 10^{17}$ atoms/cm$^3$ is formed by boron implantation and diffusion to a depth of about 8-10 μm, followed by heavy boron doping to form a $P^+$ doped layer having a concentration of about $6 \times 10^{19}$ atoms/cm$^3$ and extending to a depth of about 1-2 μm. Prior to metallization, platinum is deposited on the bottom of the substrate and diffused at a temperature of about 940° C., resulting in a platinum concentration in the $N^-$ layer of about $2.0 \times 10^{15}$ atoms/cm$^3$. Following platinum diffusion, the devices are allowed to cool slowly to about 600° C. at a rate of about 3° C./minute. As with the control series, the series formed in accordance with the present invention includes devices with die sizes of 160×160 mil$^2$ (ca. 4×4 mm$^2$), 80×80 mil$^2$ (ca. 2×2 mm$^2$), and 60×60 mil$^2$ (ca. 1.5×1.5 mm$^2$).

Figure 3:
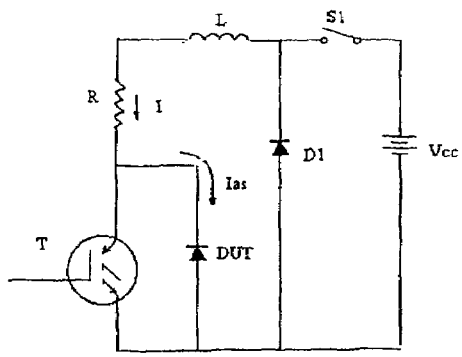
FIG. 3 is a schematic representation of an unclamped inductive switching (UIS) test circuit.

As noted above, unclamped inductive switching (UIS) is a measure of avalanche energy that can be dissipated in a device without causing its destructive failure. FIG. 3 schematically illustrates a standard test circuit for UIS measurement. Energy is first stored in an inductor L by turning on a switching transistor T (an IGBT or MOSFET, for example) during a period of time proportional to the peak current desired in inductor L. When transistor T is off, inductor L releases its current and avalanches a test device DUT until all the energy is transferred.

Measurements of VF, TRR, and BVR by standard procedures are made on the series of control devices and devices of the invention, and the results, each the average of measurements on about 2000-5000 devices, depending on die size, are presented in TABLE 1. Similar values of VF and BVR are obtained for all of the devices, both control and of the invention, regardless of die size. The TRR results do vary with die size but, for a given size, the TRR of the device of the invention is practically the same as the control, despite the lower level of platinum in the former, the result of a diffusion temperature 10° C. lower than that employed for the control device. Using a reduced concentration of platinum to achieve low VF values without increasing TRR values is an important advantage, especially for devices having voltages on the order of 200 volts.

TABLE 1

| Die Size (mil$^2$) | Pt Concentration ($\times 10^{15}$ atoms/cm$^3$) | VF (volts) | TRR (ns) | BVR (volts) | UIS (mJ) |
|---|---|---|---|---|---|
| Control 1 | 160 | 5.8 | 0.900 ± 0.010 | 32-34 | 259 ± 105 | <20 |
| Sample 1 | 160 | 2.0 | 0.909 ± 0.098 | 30-32 | 251 ± 9.8 | >304 |
| Control 2 | 80 | 5.8 | 0.905 ± 0.010 | 19-20 | 259 ± 17.4 | <0.8 |
| Sample 2 | 80 | 2.0 | 0.893 ± 0.009 | 21-22 | 257 ± 13.1 | 125 |
| Control 3 | 60 | 5.8 | 0.919 ± 0.010 | 18-19 | 255 ± 6.4 | 0 |
| Sample 3 | 60 | 2.0 | 0.908 ± 0.010 | 19-20 | 264 ± 6.4 | 72 |

TABLE 1 includes the results of UIS measurements carried out on control devices and devices of the present invention. The UIS data presented show the very large improvement in avalanche capability of the devices of the invention compared with those of control devices whose measured properties are otherwise very similar. Thus, the present invention enables the substitution of a much smaller size die to achieve UIS performance comparable to that of a larger conventional die.

Figure 4:
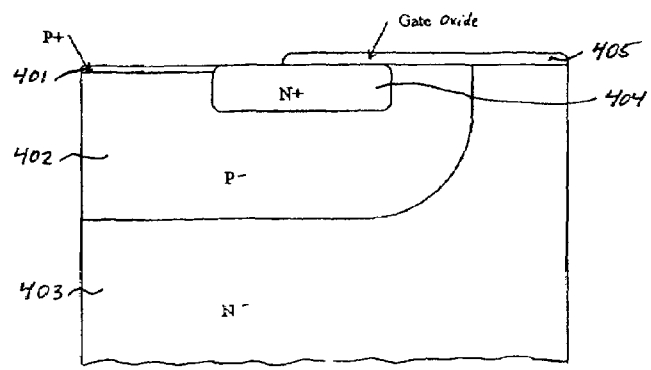
FIG. 4 is a schematic representation of a portion of the structure of a MOSFET or an IGBT power device in accordance with the present invention.

The present invention is also applicable to MOSFET and IGBT power devices. FIG. 4 schematically depicts a portion of a device 400 in accordance with the present invention that includes $P^+$ doped, $P^-$ doped, and $N^-$ doped semiconductor layers 401, 402, and 403, respectively, on a substrate (not shown). A heavily doped $N^+$ region 404 is adjacent $P^+$ and $P^-$ doped layers 401 and 402, respectively. Also shown is a gate oxide layer 405. The structure shown in FIG. 4 enables lateral current flow to be reduced and the breakdown region to be shifted to the active area during avalanche. In accordance with the present invention, a MOSFET further comprises an $N^+$ drain region (not shown) below $N^-$ layer 403; an IGBT includes a $P^+$ collector region (not shown) below layer 403. In the MOSFET or IGBT, the desired effect is the occurrence of avalanche breakdown at the vertical body-drain diode, without turning on the bipolar junction transistor (BJT) and causing the second breakdown.

The invention has been described in detail for the purpose of illustration, but it is to be understood that such detail is solely for that purpose, and variations can be made therein by those skilled in the art without departing from the spirit and scope of the invention, which is defined by the claims that follow.

What is claimed is:

1. A power semiconductor device comprising:
   a semiconductor substrate with two surfaces, an N+ doped layer extending into the substrate from one surface thereof, an N− doped layer over the N+ doped layer, a P− doped well formed in the N− doped layer and extending from the other surface of the substrate into the N− doped layer, the P− doped well having a first thickness and forming a first boundary with the N− doped layer, a P+ doped region formed in the P− doped well and extending from the other surface of the substrate into the P− doped well having a second thickness and forming a second boundary between the P+ doped region and the P− doped well, an N+ doped region formed in the other surface of the substrate, the N+ doped region having a third thickness and forming a third boundary between the N+ doped region and the N− doped layer, wherein the P+ doped region is vertically thinner than the P− doped well and vertically thinner than the N+ doped region, and recombination centers comprising noble metal impurities disposed in the N− doped layer and the P− doped well.

2. The device of claim 1 wherein the ratio of thickness of the P+ doped region to the P− doped well is between 1:40 and 1:5.

3. The device of claim 2 wherein the P+ doped region is between 0.1 and 2.0 μm thick and the P− doped well is between 4.0 and 10.0 μm thick.

4. The device of claim 1
wherein the third boundary is between the N+ doped region and the N− doped layer; and
wherein the N+ doped region is separated from the P− doped well by the N− doped layer.

5. The device of claim 4 wherein the P− doped well has a thickness of about 4 μm to about 10 μm.

6. The device of claim 4 wherein the P+ doped region has a thickness of about 0.1 μm to about 2 μm.

7. The device of claim 4 wherein the P− doped well has a dopant level of at least $10^{16}$ atoms/cm$^3$.

8. The device of claim 7 wherein the P− doped well has a dopant level of about $2.5 \times 10^{17}$ atoms/cm$^3$.

9. The device of claim 4 wherein the P+ doped region has a dopant level of at least $10^{18}$ atoms/cm$^3$.

10. The device of claim 9 wherein the P+ doped region has a dopant level of about $6 \times 10^{19}$ atoms/cm$^3$.

11. The device of claim 4 wherein the N− doped layer has a dopant level of about $10^{14}$ atoms/cm$^3$ to about $10^{15}$ atoms/cm$^3$.

12. The device of claim 4 wherein the noble metal impurities are selected from the group consisting of gold, platinum, and palladium.

13. The device of claim 12 wherein the noble metal impurities comprise platinum.

14. The device of claim 13 wherein the recombination centers are formed by platinum diffusion through the one surface of the substrate into the N− doped layer and P− doped well.

15. The device of claim 13 containing platinum impurities at a concentration of about $1 \times 10^{15}$ to about $1 \times 10^{16}$ atoms/cm$^3$.

16. The device of claim 15 wherein the concentration of platinum impurities is about $2 \times 10^{15}$ atoms/cm$^3$.

17. The device of claim 4 comprising a diode, MOSFET or an IGBT power device.

* * * * *